United States Patent
Matsuyoshi et al.

[11] Patent Number: 6,072,376
[45] Date of Patent: Jun. 6, 2000

[54] FILTER WITH LOW-NOISE AMPLIFIER

[75] Inventors: Toshimitsu Matsuyoshi, Kobe; Minoru Tachibana, Hirakata; Junichi Yoshizumi, Nara; Makoto Sakakura, Uji; Toshio Ishizaki, Kobe; Tomoki Uwano, Katano; Toshiaki Nakamura, Nara, all of Japan

[73] Assignee: Matsushita Electric Industrial Co., Ltd., Osaka, Japan

[21] Appl. No.: 08/912,122

[22] Filed: Aug. 15, 1997

[30] Foreign Application Priority Data

Aug. 22, 1996 [JP] Japan ................................. 8-220940

[51] Int. Cl.[7] ........................................ H03H 7/01
[52] U.S. Cl. ...................... 333/134; 333/206; 330/124 R
[58] Field of Search ........................ 330/124 R; 333/206, 333/134

[56] References Cited

U.S. PATENT DOCUMENTS

| | | | |
|---|---|---|---|
| 3,516,024 | 6/1970 | Lange | 333/116 |
| 3,911,372 | 10/1975 | Seidel | 330/124 R |
| 4,740,765 | 4/1988 | Ishikawa et al. | 333/206 |
| 5,101,171 | 3/1992 | Redmond | 330/124 R |
| 5,115,373 | 5/1992 | Takeda | 333/202 X |
| 5,202,653 | 4/1993 | Yamada et al. | 333/206 X |
| 5,374,910 | 12/1994 | Yamagata | 333/206 |
| 5,448,255 | 9/1995 | Hulett et al. | 333/134 X |
| 5,712,604 | 1/1998 | Tada et al. | 333/206 X |

FOREIGN PATENT DOCUMENTS

| | | |
|---|---|---|
| 0 364 931 | 4/1990 | European Pat. Off. . |
| 0 577 347 | 1/1994 | European Pat. Off. . |
| 6-216671 | 8/1994 | Japan ................................. 330/124 R |

OTHER PUBLICATIONS

Yasufumi Shiomi et al., "C–Band Satellite TV Broadcast Reception System", National Technical Report, vol. 32, No. 4, pp. 436–445, Aug. 1986.

I. Robertson et al., Solid state power amplifier using impedance transforming branch line couplers for L–band satellite systems, XP000629961, pp. 448–450, Sep. 6, 1993.

*Primary Examiner*—Justin P. Bettendorf
*Attorney, Agent, or Firm*—Wenderoth, Lind & Ponack, L.L.P.

[57] ABSTRACT

A filter with a low-noise amplifier includes: two amplification circuits, a first 3-dB hybrid circuit which is connected to an input side of the amplification circuits, a second 3-dB hybrid circuit which is connected to an output side of the amplification circuits, and a filter which is connected to one input terminal of the first 3-dB hybrid circuit. The other input terminal of the first 3-dB hybrid circuit is subjected to matched termination. A signal is inputted to an input terminal of the filter and is outputted from one output terminal of the second 3-dB hybrid circuit and the other output terminal of the second 3-dB hybrid circuit is subjected to matched termination.

14 Claims, 16 Drawing Sheets

6,072,376

FILTER WITH LOW-NOISE AMPLIFIER

BACKGROUND OF THE INVENTION

The present invention relates to a filter with a low-noise amplifier, which is mainly for use in base stations of a mobile communication system such as a vehicular phone and a portable phone.

In recent years, demand for base stations of mobile communication is increasing due to rapid spread of mobile communication. In response to this, there is a keen demand for higher performance and lower cost of low-noise amplifiers used therein. As one example of known filters with low-noise amplifiers, a low-noise amplifier used in a duplexer of a base station is required to have low-noise characteristics and thus, an input matching circuit is designed so as to have a minimum noise figure. On the other hand, this low-noise amplifier is usually used so as to be connected, at its input, to an antenna duplexer. A filter in the antenna duplexer is designed so as to exhibit desired characteristics in a state of impedance matching. Thus, in order to gain the characteristics of the filter in the antenna duplexer, impedance between the filter and the amplifier should be matched. Thus, in order to satisfy both impedance matching and noise figure matching, an isolator is inserted between the filter and the input matching circuit of the low-noise amplifier as described in "National Technical Report" Vol. 32, No. 4, August 1986, pp. 437–438. By employing this circuit configuration, not only impedance matching is obtained at the input terminal but noise figure matching is obtained at the input of the amplifying element.

However, in the above described configuration, the isolator is required to be provided for satisfying both impedance matching and noise figure matching. Since the isolator is inserted at the input side of the low-noise amplifier, insertion loss of the isolator deteriorates noise figure of the circuit directly. In addition, the isolator is quite expensive, which hampers low production cost of the circuit.

SUMMARY OF THE INVENTION

Accordingly, an essential object of the present invention is to provide a filter with a low-noise amplifier, which satisfies both impedance matching and noise figure matching without using an isolator and has low-noise characteristics.

Another object of the present invention is to provide a filter with a low-noise amplifier, which is least likely to be affected by a disturbing signal.

In order to accomplish these objects of the present invention, a filter with a low-noise amplifier, according to the present invention comprises two amplification circuits disposed in parallel, first and second 3-dB hybrid circuits connected to an input side and an output side of the amplification circuits, respectively, and a filter connected to one end of an input terminal of the first 3-dB hybrid circuit.

By the above described arrangement of the filter of the present invention, in which the 3-dB hybrid circuits are used together with the amplifier, both impedance matching and noise figure matching can be satisfied without using an isolator. By this arrangement of the filter of the present invention, more excellent noise figure characteristics and lower distortion characteristics than those of a filter with a low-noise amplifier, which employs an isolator, can be obtained without incurring deterioration of performance of the filter. Furthermore, if the filter includes a notch filter or is arranged to have a multi-stage connection in order to strengthen its capability for eliminating a disturbing signal, the filter can be least likely to be affected by a disturbing signal in addition to realizing the low distortion characteristics of the amplifier. In addition, by eliminating the isolator, production cost of the filter can be greatly reduced.

BRIEF DESCRIPTION OF THE DRAWINGS

These objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
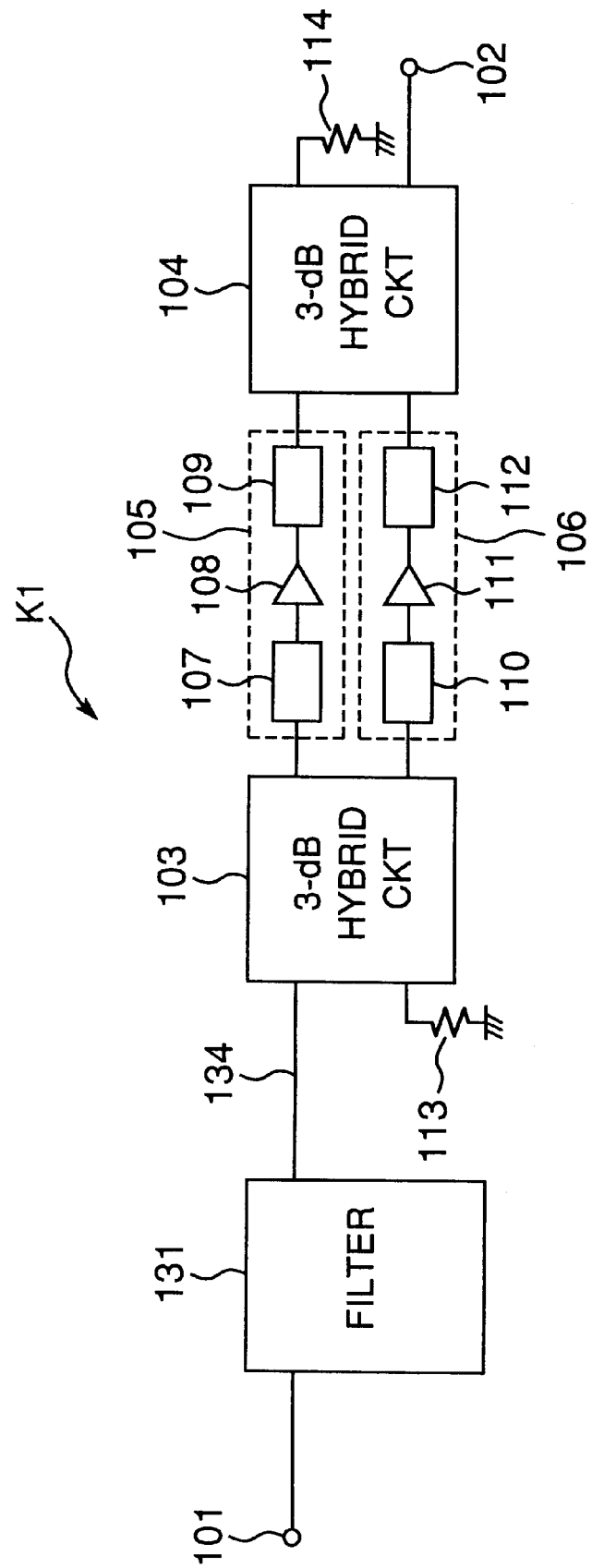
FIG. 1 is a block diagram of a filter with a low-noise amplifier, according to a first embodiment of the present invention.
Figure 3:
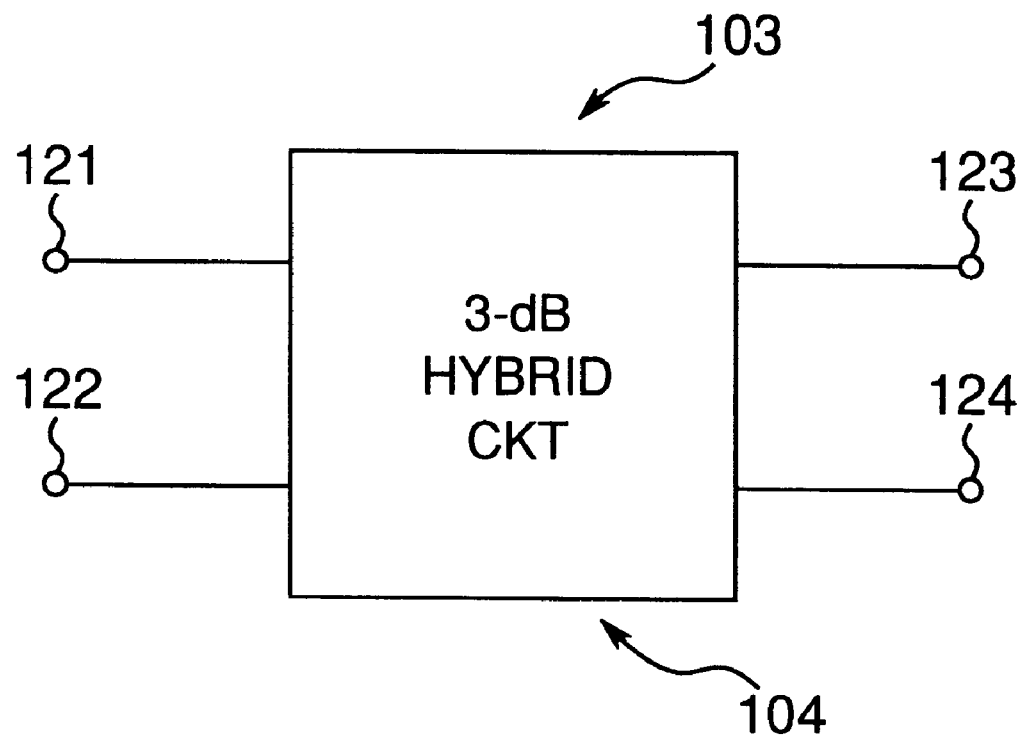
FIG. 3 is a block diagram showing terminals of a 3-dB hybrid circuit employed in the low-noise amplifier of FIG. 1.

Hereinafter, a amplifier K1 with a low-noise filter, according to a first embodiment of the present invention is described with reference to the drawings. In FIG. 1, the filter K1 includes an input terminal 101, an output terminal 102, first and second 3-dB hybrid circuits 103 and 104, first and second amplification circuits 105 and 106 and a filter 131. The first amplification circuit 105 is constituted by an input matching circuit 107, an amplification element 108 and an output matching circuit 109 which are connected to each other in series. Likewise, the second amplification circuit 106 is constituted by an input matching circuit 110, an amplification circuit 111 and an output matching circuit 112 which are connected to each other in series. Each of the first and second 3-dB hybrid circuits 103 and 104 includes a first terminal 121, a second terminal 122, a third terminal 123 and a fourth terminal 124 as shown in FIG. 3.

Next, a circuit configuration of the filter 131 of the filter K1 is described with reference to FIG. 2. The input terminal 101 is connected to a dielectric resonator 141 through a coupling capacitor 151 and the dielectric resonator 141 is, in turn, connected to a dielectric resonator 142 via a coupling capacitor 152. Meanwhile, the dielectric resonator 142 is connected to a dielectric resonator 143 by way of a coupling capacitor 153 and the dielectric resonator 143 is, in turn, connected to a dielectric resonator 144 through a coupling capacitor 154. Furthermore, the dielectric resonator 144 is connected to a dielectric resonator 145 via a coupling capacitor 155 and the dielectric resonator 145 is, in turn, connected to a dielectric resonator 146 by way of coupling capacitors 156 and 157. The junction of the coupling capacitors 156 and 157 leads to an output terminal 134. The filter 131 has an input/output impedance of, for example, 50 Ω.

Next, a circuit configuration of the filter K1 is described with reference to FIG. 2. The input terminal 101 is connected to one end of the filter 131, while the other end of the filter 131 is connected to the first terminal 121 of the first 3-dB hybrid circuit 103. The third terminal 123 of the first 3-dB hybrid circuit 103 is connected, through the first input matching circuit 107, to an input of the first amplification element 108. Likewise, the fourth terminal 124 of the first 3-dB hybrid circuit 103 is connected, through the second input matching circuit 110, to an input of the second amplification element 111. An output of the first amplification element 108 is connected to the first terminal 121 of the second 3-dB hybrid circuit 104 via the first output matching circuit 109. Similarly, an output of the second amplification element 111 is connected to the second terminal 122 of the second 3-dB hybrid circuit 104 via the second output matching circuit 112. The fourth terminal 124 of the second 3-dB hybrid circuit 104 is connected to the output terminal 102. The second terminal 122 of the first 3-dB hybrid circuit 103 is grounded by way of a terminal resistor 113, while the third terminal 123 of the second 3-dB hybrid circuit 104 is grounded by way of a terminal resistor 114.

Figure 4:
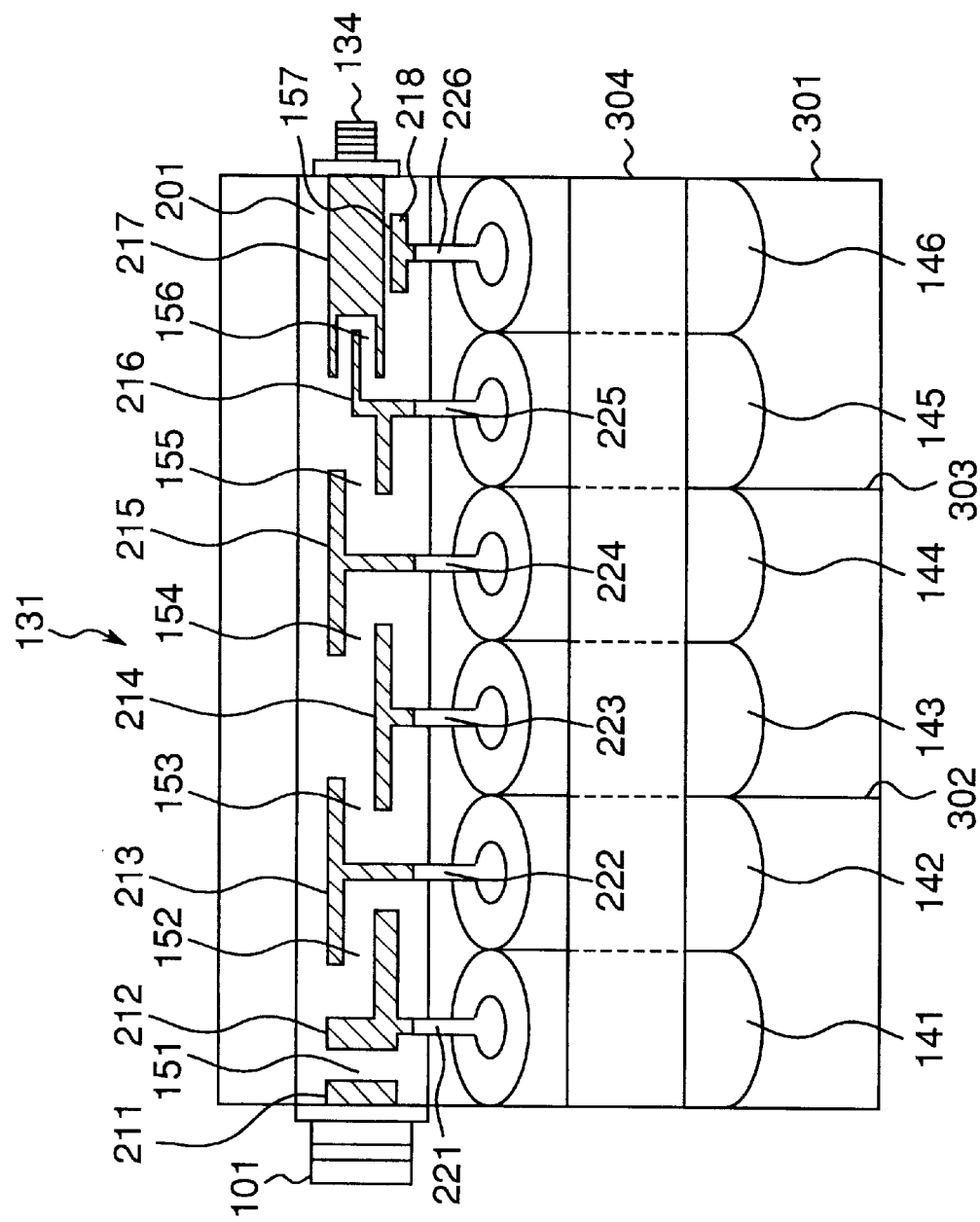
FIG. 4 is a top plan view of a filter portion of the filter of FIG. 1.
Figure 5:
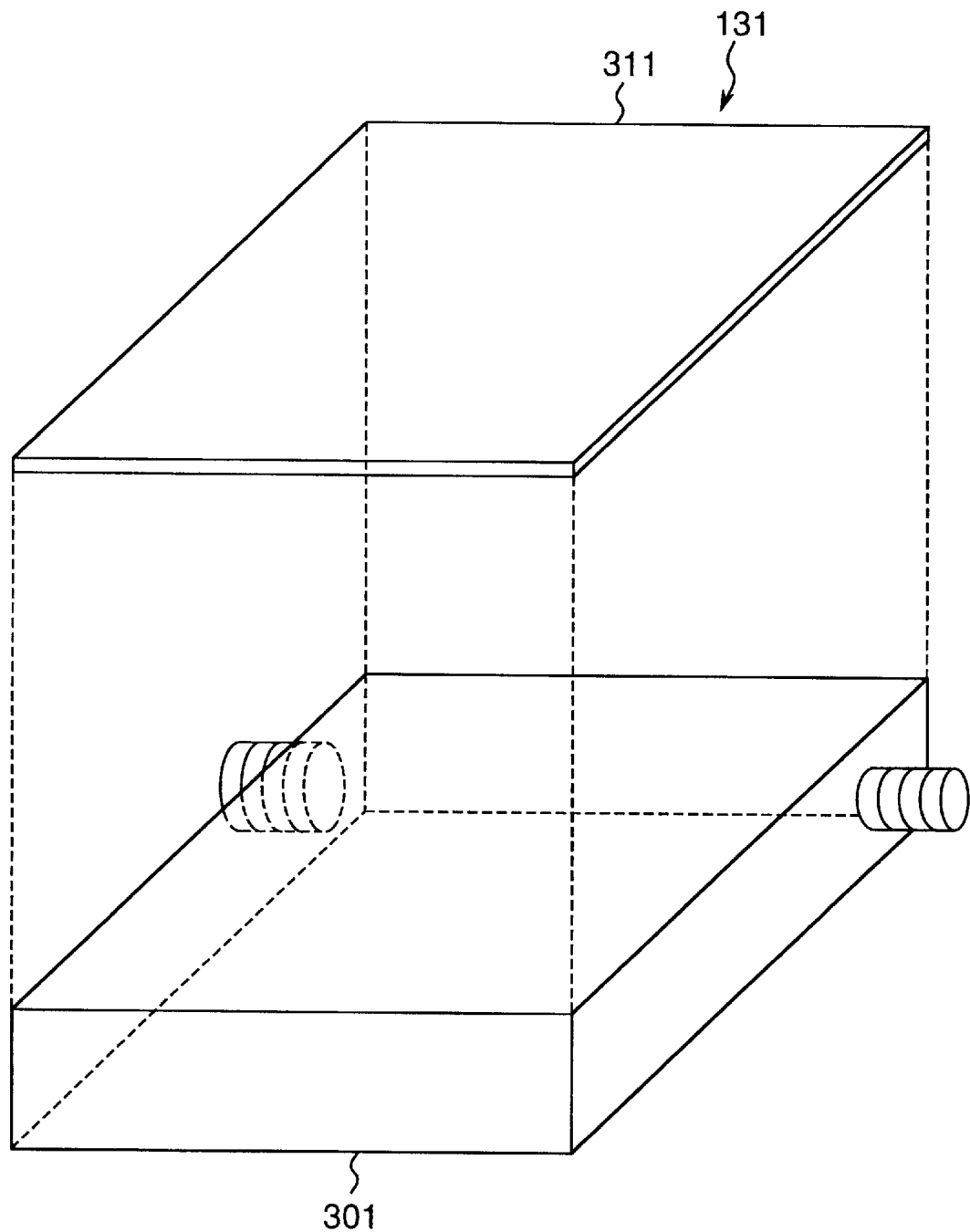
FIG. 5 is an exploded perspective view of the filter portion of FIG. 4.

Next, a construction of the filter 131 of the filter K1 is described with reference to FIG. 4. In FIG. 4, the filter 131 includes an alumina substrate 201, connection fitments 221 to 226, a shielding and grounding housing 301, partitions 302 and 303 and a grounding cover 304 for grounding the resonators 141 to 146. For example, each of the members 301 to 304 is obtained by plating an iron piece with copper and then, plating the copper-plated iron piece with silver. Meanwhile, each of the dielectric resonators 141 to 146 is formed by a cylindrical dielectric coaxial resonator having an open distal end. The coupling capacitors 151 to 157 are obtained by forming copper patterns 211 to 218 on the alumina substrate 201. An N type connector is employed as the input terminal 101. In order to not only fully ground outer conductors of the dielectric resonators 141 to 146 but positively shield the dielectric resonators 141 to 146 from external electromagnetic field, the dielectric resonators 141 to 146 are covered by an upper cover 311 as shown in FIG. 5.

Figure 2:
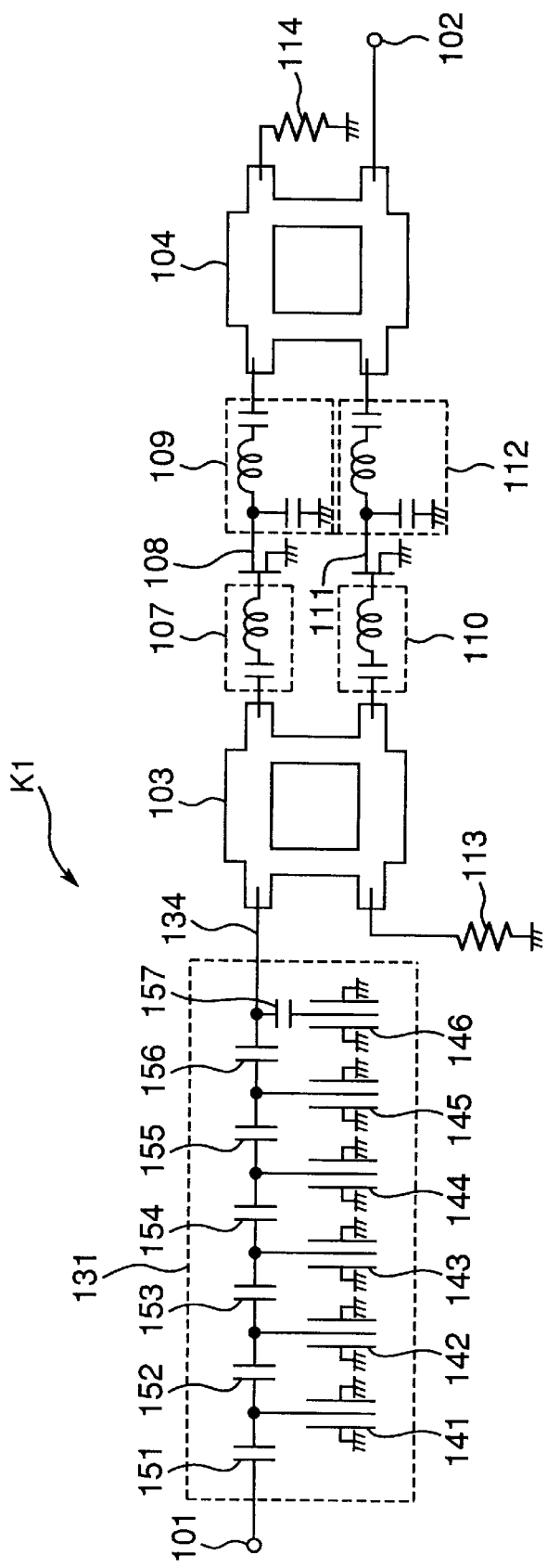
FIG. 2 is a circuit diagram of the filter of FIG. 1.
Figure 6:
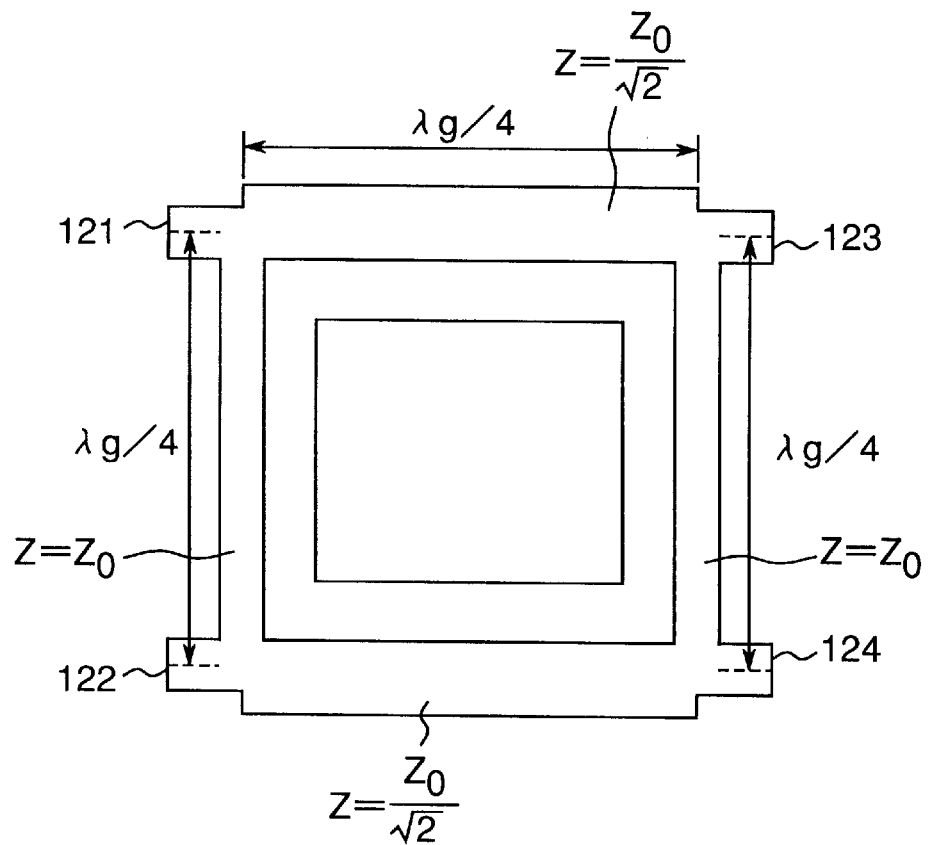
FIG. 6 is a circuit diagram of the 3-dB hybrid circuit of FIG. 3 constituted by a distributed constant circuit.

Meanwhile, in FIG. 2, each of the first and second 3-dB hybrid circuits 103 and 104 is formed by a distributed constant circuit formed on a TEFLON substrate i.e., polytetrafluorethyene as shown in FIG. 6. Each of the amplification elements 108 and 111 is formed by a GaAs FET and each of the matching circuits 107, 109, 110 and 112 is formed by a circuit including a coil and a capacitor. The first input matching circuit 107 has a circuit configuration identical with that of the second input matching circuit 110. Likewise, the first output matching circuit 109 has a circuit configuration identical with that of the second output matching circuit 110.

Hereinafter, operation of the filter K1 of the above described arrangement is described. In a reception system block used in a base station for mobile communication, since amplifiers, especially, an amplifier of an initial stage, should satisfy low-noise characteristics, the input matching circuit of the reception system block is required to be designed so as to have a minimum noise figure. On the other hand, such an amplifier for reception is usually utilized by connecting an antenna duplexer to an input of the amplifier and a filter in the antenna duplexer is designed so as to exhibit desired characteristics in a state of impedance matching. Therefore, in order to gain the characteristics of the filter in the antenna duplexer, impedance between the filter and the amplifier should be matched. Namely, both impedance matching and noise figure matching should be achieved.

Between the third and fourth terminals 123 and 124 of the first 3-dB hybrid circuit 103 in the circuit of this embodiment, noise figure matching is achieved but impedance matching is not achieved. As a result, a reflected wave is produced at the third and fourth terminals 123 and 124. However, the reflected wave produced at the third and fourth terminals 123 and 124 of the first 3-dB hybrid circuit 103 wholly flows to the second terminal 122 and does not flow to the first terminal 121 acting as an input terminal. Accordingly, if viewed from the first terminal 121 of the first 3-dB hybrid circuit 103, impedance is matched in the first 3-dB hybrid circuit 103. In the circuit of this embodiment, neither performance of the filter nor performance of the low-noise amplifier deteriorates. Namely, in the filter K1 of the present invention, both impedance matching and noise figure matching are achieved without using an isolator.

Table 1 below shows noise figure characteristics of the filter K1 in comparison with those of prior art.

TABLE 1

| [Frequency (MHz)] | [Noise figure (dB)] | |
| --- | --- | --- |
|  | (Filter K1) | (Prior art) |
| 890 | 1.83 | 2.02 |
| 900 | 1.59 | 1.92 |
| 915 | 1.75 | 2.19 |

It is apparent from Table 1 above that noise figure characteristics of the filter K1 are more excellent than those of prior art.

In this embodiment as described above, since the two amplification circuits connected to each other in parallel and the two 3-dB hybrid circuits are connected to the input and the output of each of the amplification circuits, respectively, both impedance matching and noise figure matching can be achieved without using an isolator. Furthermore, the filter of the present invention has noise figure characteristics more excellent than those of prior art.

Meanwhile, since the amplification circuits are connected to each other in parallel in the filter K1, input power applied to each of the amplification circuits becomes a half of that of a case in which the amplification circuits are not connected to each other in parallel. Hence, even in case power of the same level is inputted to the amplifiers of parallel connection and the amplifiers of nonparallel connection, distorted power produced in the amplifiers of parallel connection becomes smaller than that of the amplifiers of nonparallel connection. For example, a third order intermodulation distortion component produced in a pass band of the amplifiers of parallel connection is reduced by 6 dB in comparison with that of the amplifiers of nonparallel connection. Therefore, in the present invention, the intercept point of the amplifiers also rises, thereby resulting in lower distortion characteristics.

The filter is arranged to have an attenuation pole or a multi-stage connection in order to strengthen its capability for eliminating disturbing signals. Thus, by combining low distortion characteristics of the amplifiers and the disturbing signal eliminating capability of the filter, the filter K1 of the present invention is least likely to be affected by a disturbing signal. In this embodiment, since a notch circuit is constituted by the dielectric resonator 146 and the coupling capacitor 157, the filter K1 is least likely to be affected by, especially, a disturbing signal of a frequency lower than its pass band. Meanwhile, in the filter K1 of the present invention, since the isolator is not employed, production cost of the filter K1 can be reduced. Furthermore, in the present invention, since each of the amplification elements used for the amplification circuits is formed by a GaAs FET and each of the 3-dB hybrid circuits 103 and 104 is formed by a distributed constant circuit employing a TEFLON substrate, low-noise characteristics are gained.

Figure 7:
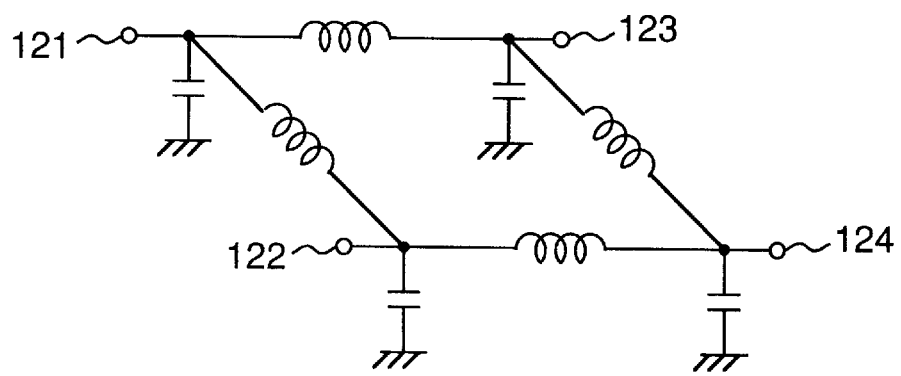
FIG. 7 is a circuit diagram of the 3-dB hybrid circuit of FIG. 3 constituted by a lumped element circuit.

Meanwhile, in this embodiment, each of the 3-dB hybrid circuits 103 and 104 is formed by the distributed constant circuit employing the TEFLON substrate as shown in FIG. 6 but may also be formed by another circuit. If the 3-dB hybrid circuit is formed by a distributed constant circuit on a substrate having a large dielectric constant, a lumped element circuit shown in FIG. 7 or an integrated chip 3-dB hybrid circuit, the 3-dB hybrid circuit can be made more compact. Meanwhile, if a circuit formed on a low-loss substrate is employed as the first 3-dB hybrid circuit 103, noise figure characteristics can be further improved. In addition, if the low-loss circuit is employed as the first 3-dB hybrid circuit 103 and the integrated chip 3-dB hybrid is employed as the second 3-dB hybrid circuit 104 in combination, both improvement of noise figure characteristics and more compactness of the circuit can be achieved.

Figure 8:
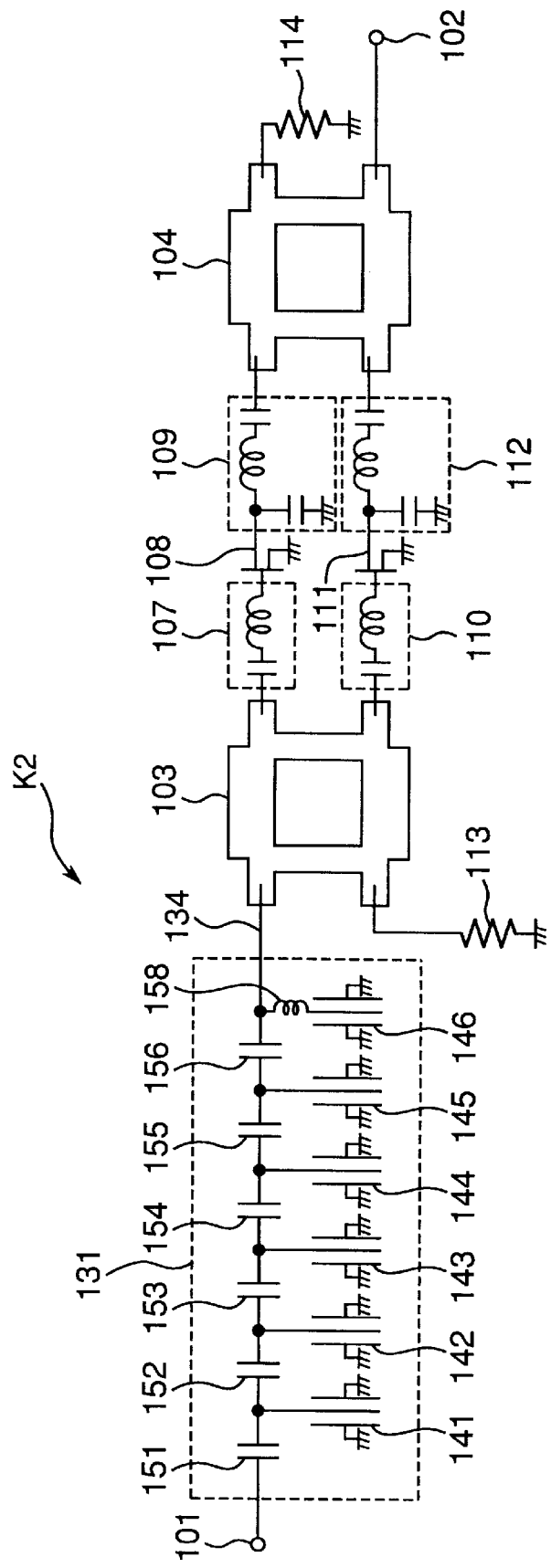
FIG. 8 is a circuit diagram of a filter with a low-noise amplifier, according to a second embodiment of the present invention.

FIG. 8 shows a filter K2 with a low-noise amplifier, according to a second embodiment of the present invention. In the filter K2, the coupling capacitor 157 of the filter K1 is replaced by a coupling coil 158. Since other constructions of the filter K2 are similar to those of the filter K1, the description is abbreviated for the sake of brevity.

Since a notch circuit is constituted by the dielectric resonator 146 and the coupling coil 158 in the filter K2, the filter K2 is least likely to be affected by, especially, a disturbing signal of a frequency higher than its pass band. Except for this point, the same effects as those of the filter K1 can be gained in the filter K2.

Figure 9:
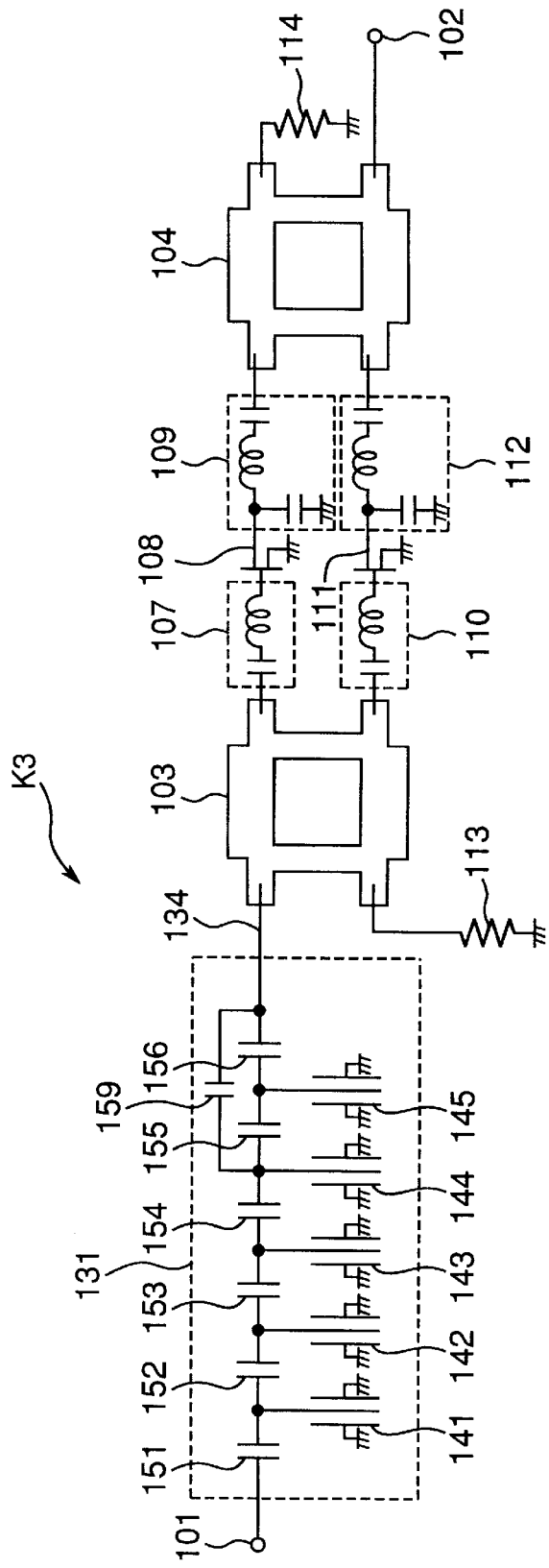
FIG. 9 is a circuit diagram of a filter with a low-noise amplifier, according to a third embodiment of the present invention.

FIG. 9 shows a filter K3 with a low-noise filter, according to a third embodiment of the present invention. In the filter K3, the dielectric resonator 146 and the coupling capacitor 157 of the filter K1 are eliminated and a coupling capacitor 159 is employed so as to connect a junction of the coupling capacitors 154 and 155 and the output terminal 134. Since other constructions of the filter K3 are similar to those of the filter K1, the description is abbreviated for the sake of brevity.

In the filter K3, a notch circuit is obtained by connecting the coupling capacitor 159 so as to cause the coupling capacitor 159 to jump over the dielectric resonator 145. Therefore, the filter K3 is least likely to be affected by, a especially, disturbing signal of a frequency lower than its pass band. Meanwhile, in the filter K3, the number of the dielectric resonators is reduced in comparison with that of the filters K1 and K2. Except for this point, the same effects as those of the filter K1 can be achieved in the filter K3.

Meanwhile, in this embodiment, the coupling capacitor 159 is connected so as to jump over the dielectric resonator 145 but may also be connected so as to jump over one of the remaining dielectric resonators 141 to 144.

Figure 10:
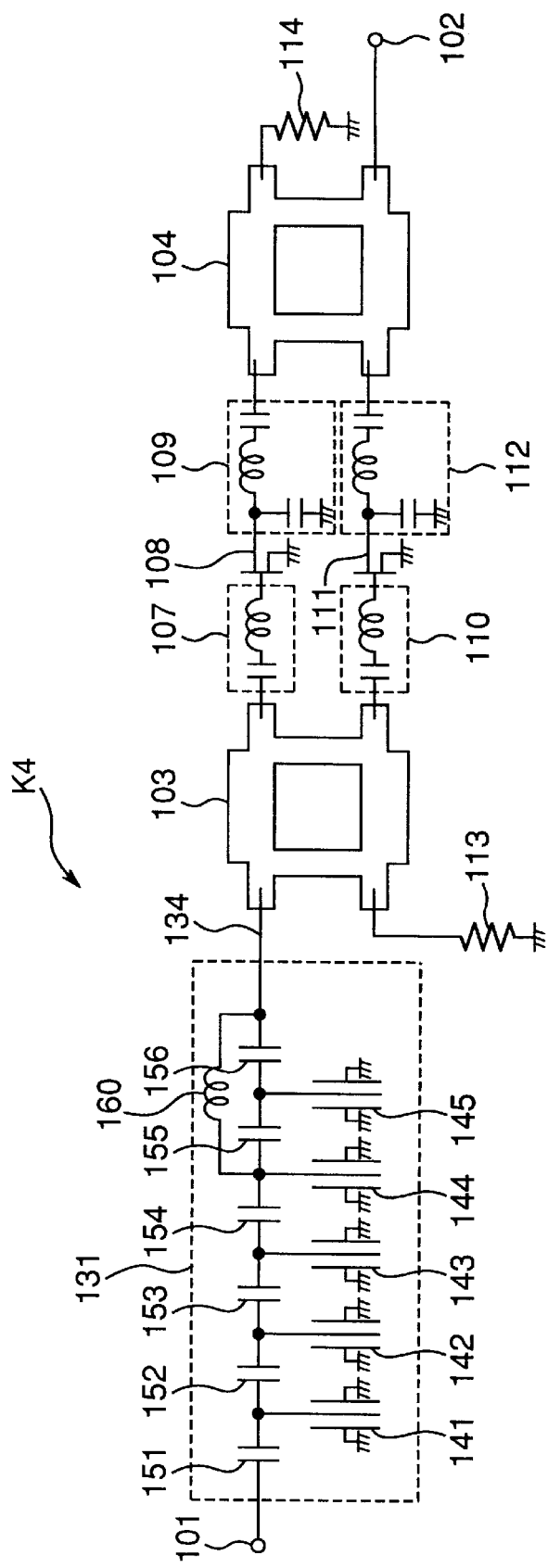
FIG. 10 is a circuit diagram of a filter with a low-noise amplifier, according to a fourth embodiment of the present invention.

FIG. 10 shows a filter K4 with a low-noise amplifier, according to a fourth embodiment of the present invention. In the filter K4, the coupling capacitor 159 of the filter K3 is replaced by a coupling coil 160. Since other constructions of the filter K4 are similar to those of the filter K3, the description is abbreviated for the sake of brevity.

In this embodiment, a notch circuit is obtained by connecting the coupling coil 160 so as to cause the coupling coil 160 to jump over the dielectric resonator 145. Thus, the filter K4 is least likely to be affected by, especially, a disturbing signal of a frequency higher than its pass band. Meanwhile, in the filter K4, the number of the dielectric resonators is reduced in comparison with that of the filters K1 and K2 in the same manner as the filter K3. Except for these points, the same effects as those of the filter K1 can be achieved in the filter K4.

Meanwhile, in this embodiment, the coupling coil 160 is connected so as to jump over the dielectric resonator 145 but may also be connected so as to jump over one of the remaining dielectric resonators 141 to 144.

Figure 11:
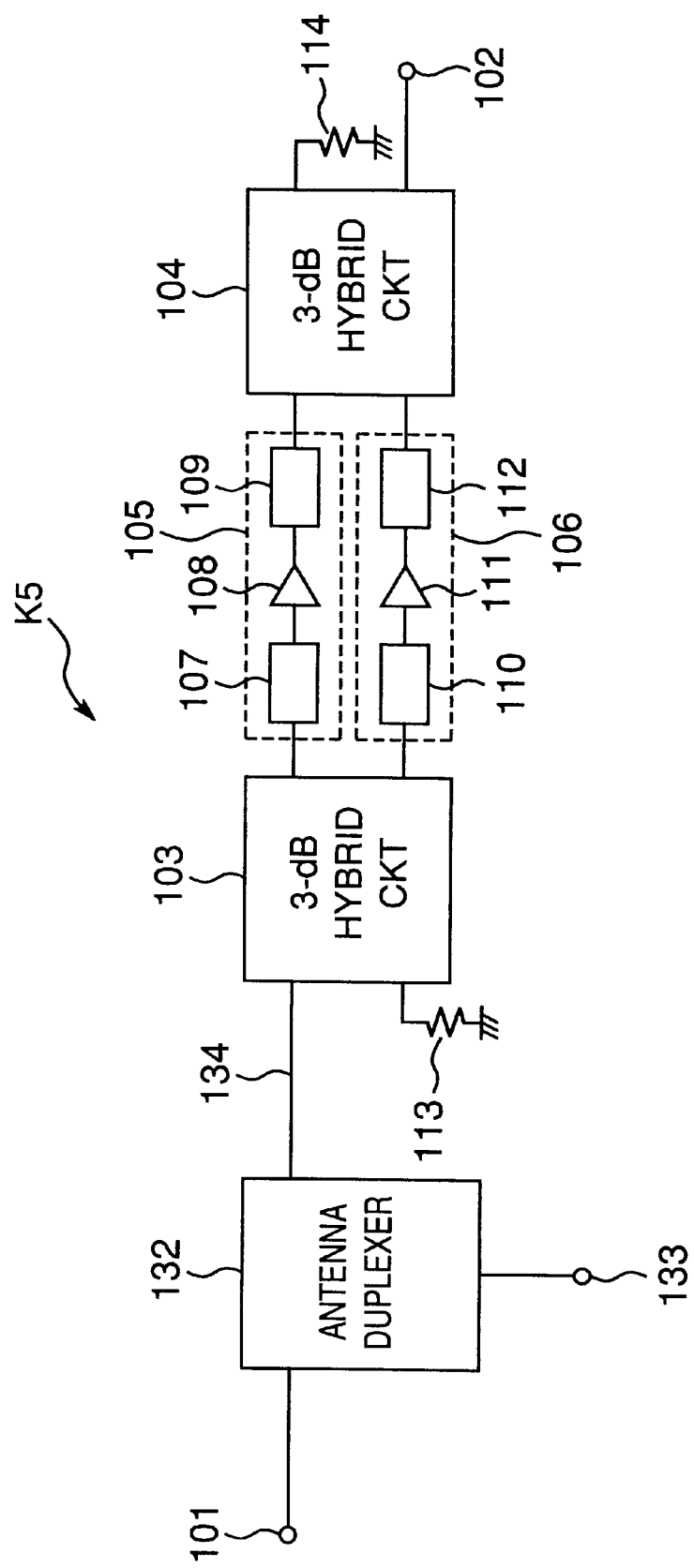
FIG. 11 is a block diagram of a filter with a low-noise amplifier, according to a fifth embodiment of the present invention.

Hereinafter, a filter K5 with a low-noise amplifier, according to a fifth embodiment of the present invention is described with reference to FIGS. 11 to 14. In FIG. 11, the filter K5 includes an antenna duplexer 132 and a terminal 133 for transmission. In the filter K5, the filter 131 of the filter K1 is replaced by the antenna duplexer 132. Since other constructions of the filter K5 are similar to those of the filter K1, the description is abbreviated for the sake of brevity.

Figure 12:
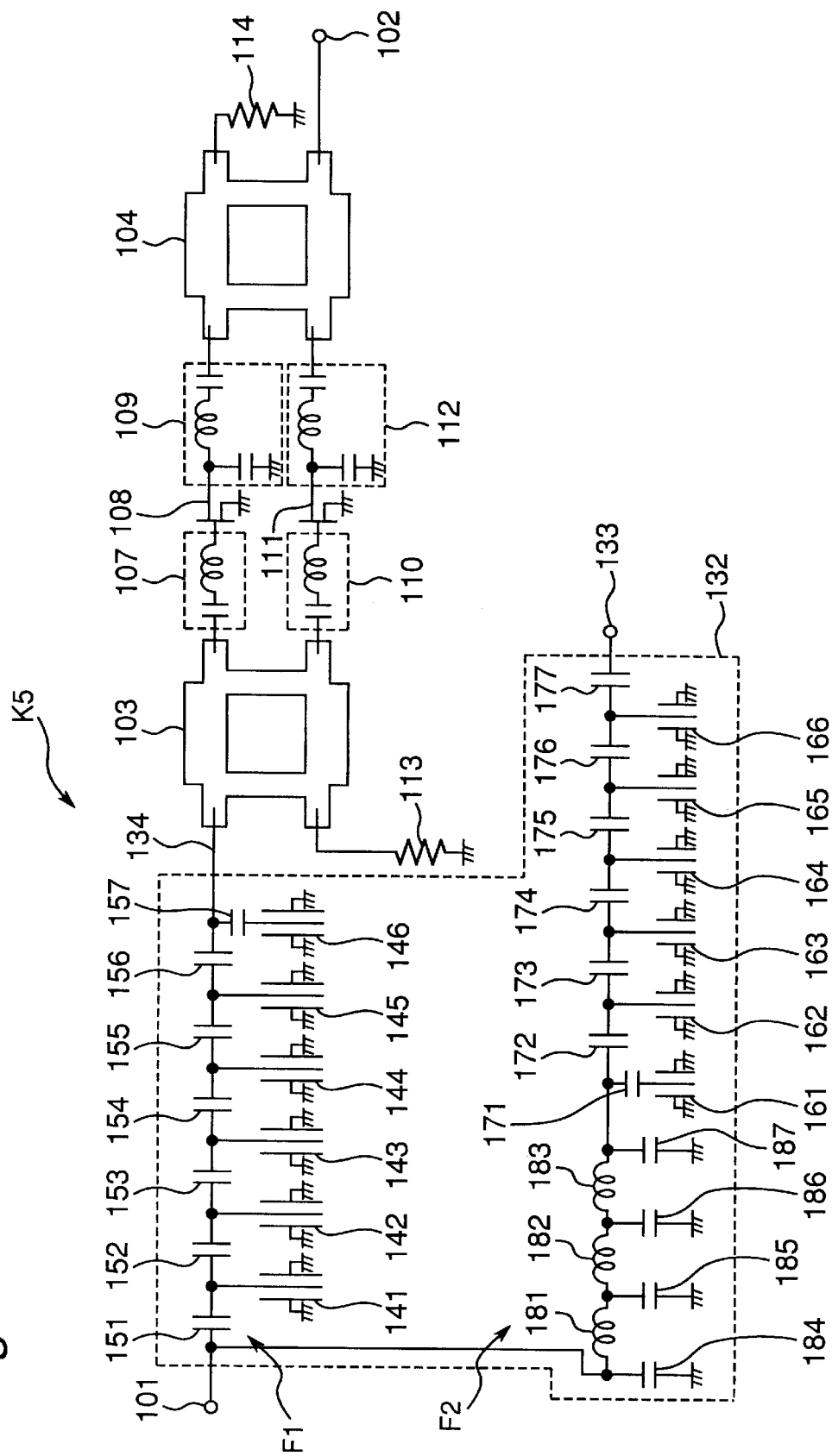
FIG. 12 is a circuit diagram of the filter of FIG. 11.

Then, a circuit configuration of the antenna duplexer 132 is described with reference to FIG. 12. The antenna duplexer 132 includes a reception filter F1 and a transmission filter F2. The reception filter F1 includes the dielectric resonators 141 to 146 and the coupling capacitors 151 to 157. On the other hand, the transmission filter F2 includes dielectric resonators 161 to 166, coupling capacitors 171 to 177, inductors 181 to 183 and capacitors 184 to 187. The input terminal 101 leads to the reception filter F1 and the transmission filter F2.

The transmission filter F2 includes circuitry in which the grounded capacitors 184 to 187 and the inductors 181 to 183 connected to each other in series are connected to each other alternately from the input terminal 101 such that the circuitry is connected to the dielectric resonator 161 through the coupling capacitor 171. The dielectric resonators 161 and 162 are connected to each other via the coupling capacitors 171 and 172, while the dielectric resonators 162 and 163 are connected to each other by way of the coupling capacitor 173. The dielectric resonators 163 and 164 are connected to each other through the coupling capacitor 174, while the dielectric resonators 164 and 165 are connected to each other via the coupling capacitor 175. Furthermore, the dielectric resonators 165 and 166 are connected to each other by way of the coupling capacitor 176, while the dielectric resonator 166 and the terminal 133 are connected to each other through the coupling capacitor 177. The terminal 133 is, for example, connected to a 50-Ω circuit or is subjected to matched termination of 50 Ω. Configuration of the reception filter F1 is identical with that of the filter 131 of the filter K1 shown in FIG. 2. For example, each terminal of the antenna duplexer 132 has an input/output impedance of 50 Ω.

Figure 13:
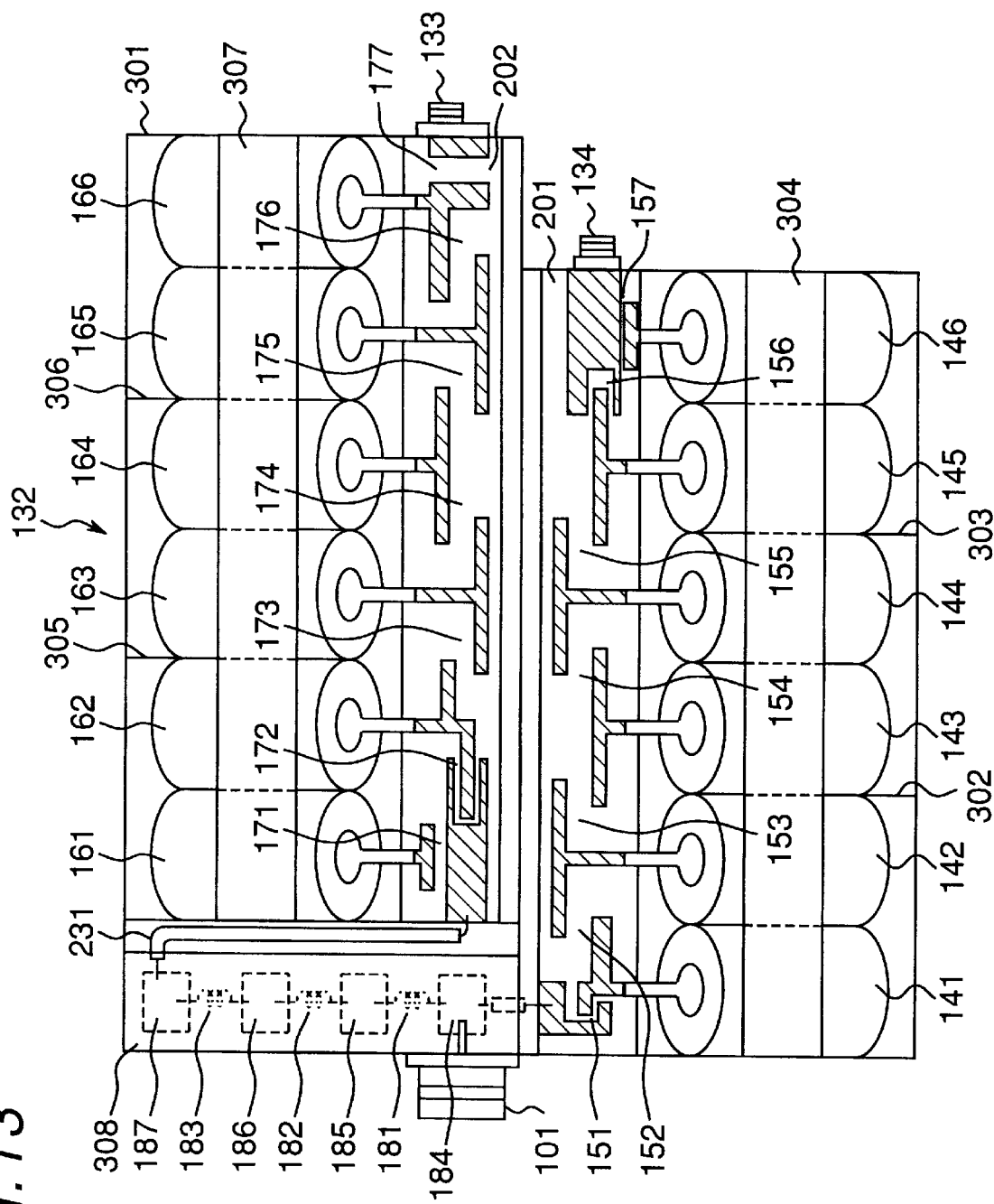
FIG. 13 is a top plan view of an antenna duplexer of the filter of FIG. 11.
Figure 14:
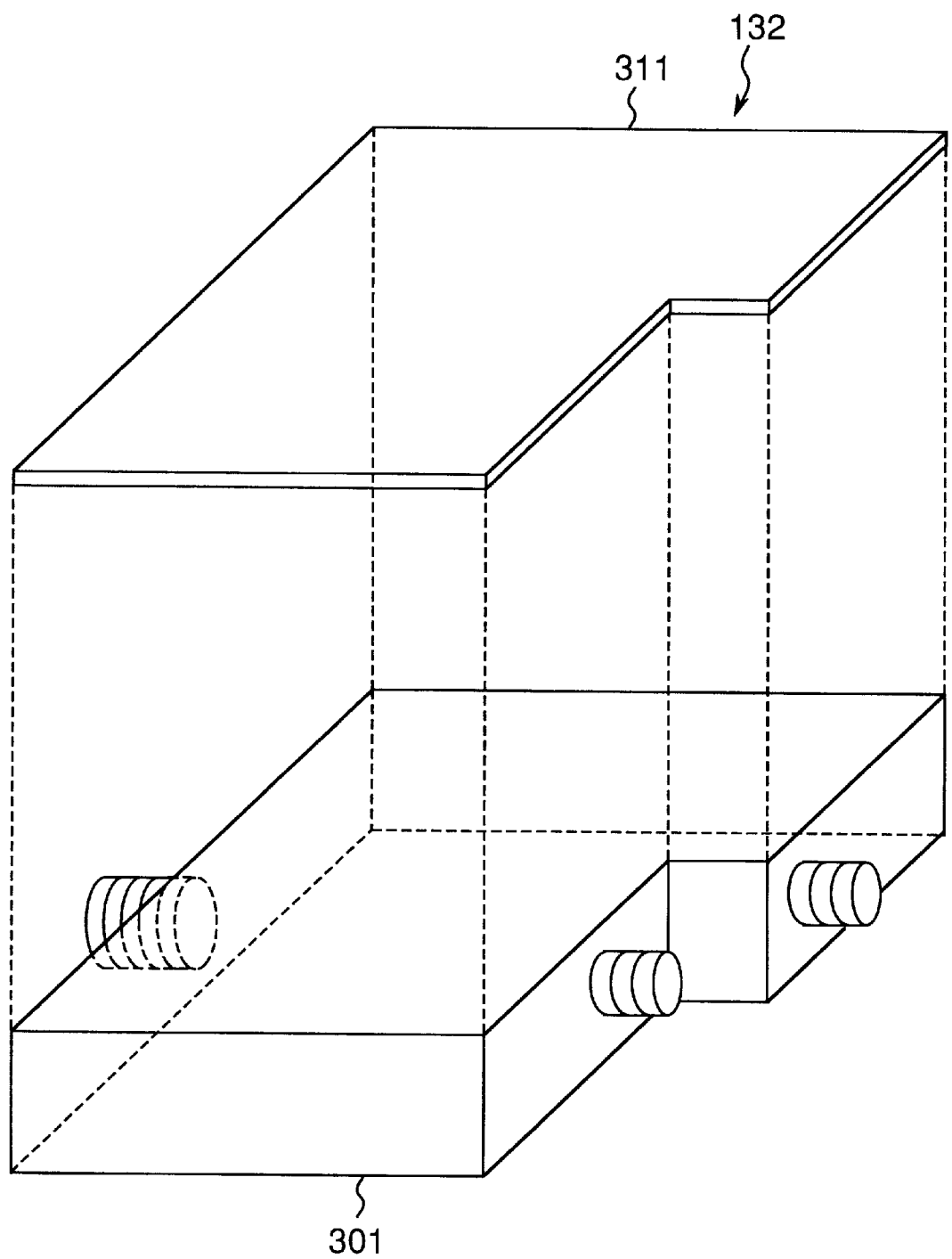
FIG. 14 is an exploded perspective view of a filter portion of the filter of FIG. 11.

Next, a construction of the antenna duplexer 132 is described with reference to FIG. 13. The antenna duplexer 132 includes alumina substrates 201 and 202, a transmission line 231, the shielding and grounding housing 301, partitions 302, 303, 305 and 306 and grounding covers 304, 307 and 308. For example, each of the members 301 to 308 is obtained by plating an iron piece with copper and then, plating the copper-plated iron piece with silver. Meanwhile, each of the dielectric resonators 141 to 146 and 161 to 166 is formed by a cylindrical dielectric coaxial resonator having an open distal end. The coupling capacitors 151 to 157 and 171 to 177 are obtained by forming copper patterns on the alumina substrates 201 and 202, respectively. An air-core coil is employed as each of the serial inductors 181 to 183. Each of the grounded capacitors 184 to 187 is formed by an alumina substrate to opposite faces of which a copper pattern is attached. A semirigid cable having a characteristic impedance of 50 Ω is employed as the transmission line 231. An N type connector is employed as the input terminal 101. In order to not only fully ground outer conductors of the dielectric resonators 141 to 146 and 161–166 but positively shield the dielectric resonators 141 to 146 and 161 to 166 from external electromagnetic field in the same manner as the filter K1, the dielectric resonators 141 to 146 and 161–166 are covered by the upper cover 311 as shown in FIG. 14.

Next, a circuit configuration of the filter K5 is described with reference to FIG. 12. The input terminal 101 is connected to one terminal of the antenna duplexer 132 referred to above. The output terminal 134 from the reception filter F1 of the antenna duplexer 132 is connected to the first terminal 121 of the 3-dB hybrid circuit 103 and the third terminal 123 of the first 3-dB hybrid circuit 103 is connected, through the first input matching circuit 107, to the input of the first amplification element 108. The fourth terminal 124 of the first 3-dB hybrid circuit 103 is connected, through the second input matching circuit 110, to the input of the second amplification element 111. The output of the first amplification element 108 is connected to the first terminal 121 of the second 3-dB hybrid circuit 104 via the first output matching circuit 109, while the output of the second amplification element 111 is connected to the second terminal 122 of the second 3-dB hybrid circuit 104 via the second output matching circuit 112. The fourth terminal of the second 3-dB hybrid circuit 104 is connected to the output terminal 102. The second terminal 122 of the first 3-dB hybrid circuit 103 is grounded by way of the terminal resistor 113, while the third terminal 123 of the second 3-dB hybrid circuit 104 is grounded by way of the terminal resistor 114. The terminal 133 from the transmission filter F2 of the antenna duplexer 132 is, for example, connected to a 50-Ω circuit or is subjected to matched termination of 50 Ω.

In the same manner as the first embodiment, impedance matching between the filter F1 of the antenna duplexer 132 and the amplification circuits 105 and 106 is achieved in the filter K5. Furthermore, noise figure matching of the first embodiment is also satisfied in the filter K5. Therefore, in the filter K5, low-noise characteristics more excellent than those of a circuit employing an isolator can be gained without using an isolator by extracting characteristics of the filters F1 and F2 of the antenna duplexer 132. Meanwhile, the filter K5 is least likely to be affected by a disturbing signal due to a lower distortion of the amplification circuits 105 and 106 and an improvement in the disturbing signal eliminating capability of the filters F1 and F2 of the antenna duplexer 132 can be achieved in the same manner as the first embodiment. Since a notch circuit is constituted by the dielectric resonator 146 and the coupling capacitor 157 in the filter K5 in the same manner as the first embodiment, the filter K5 is least likely to be affected by, a especially, disturbing signal of a frequency lower than its pass band.

If a single antenna is used for both transmission and reception in a mobile communication system, it is essential to provide an antenna duplexer. Thus, if the antenna duplexer is directly connected to a low-noise amplifier into a module, the need for complicated adjustments is eliminated and thus, a system can be formulated easily.

Figure 15:
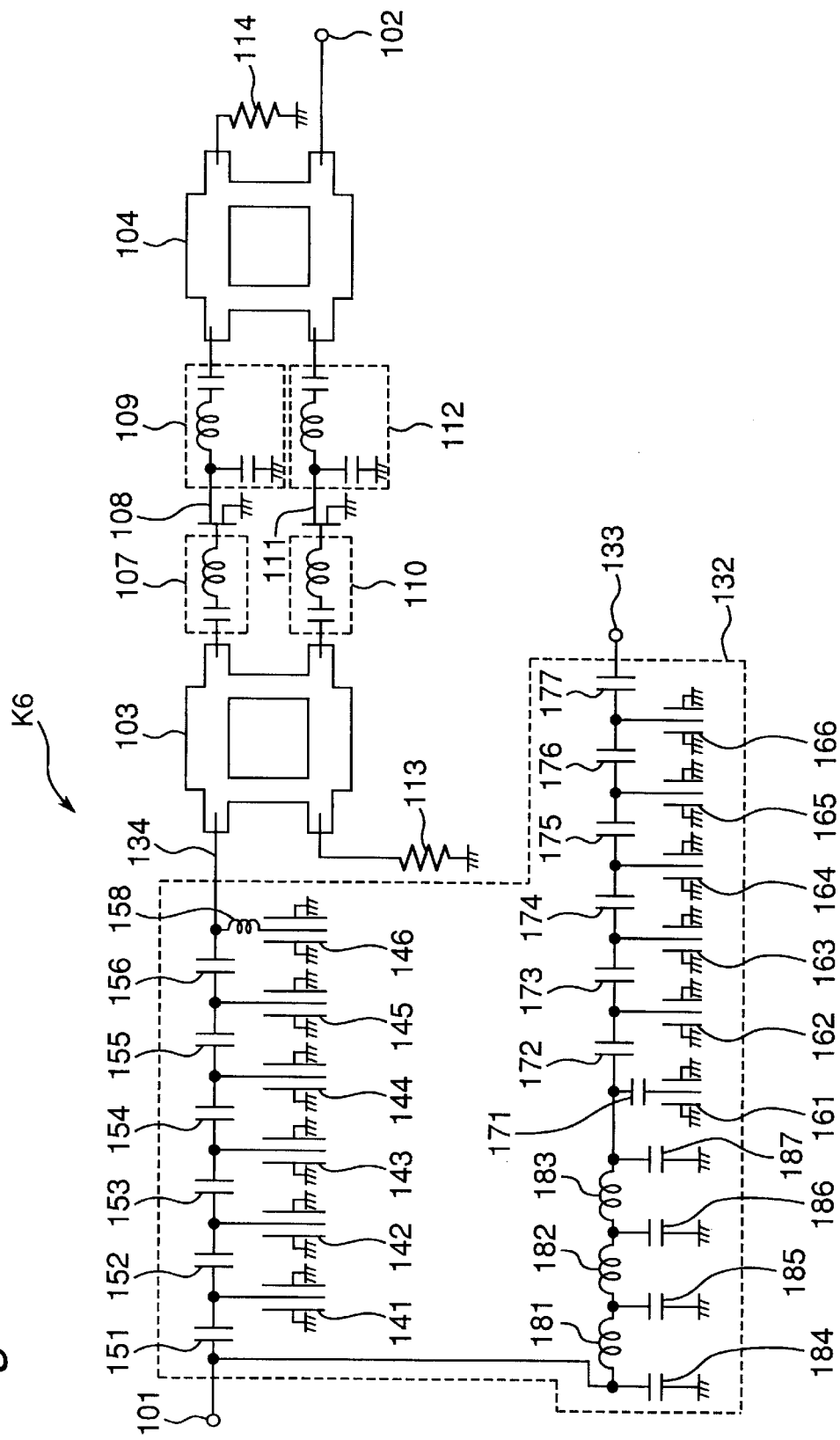
FIG. 15 is a circuit diagram of a filter with a low-noise amplifier, according to a sixth embodiment of the present invention.

FIG. 15 shows a filter K6 with a low-noise amplifier, according to a sixth embodiment of the present invention. In the filter K6, the coupling capacitor 157 of the filter K5 is replaced by the coupling coil 158. Since other constructions of the filter K6 are similar to those of the filter K5, the description is abbreviated for the sake of brevity.

Since a notch circuit is formed by the dielectric resonator 146 and the coupling coil 158 in the filter K6 in the same manner as the second embodiment, the filter K6 is least likely to be affected by, a especially, disturbing signal of a frequency higher than its pass band. Except for this point, the same effects as those of the filter K5 can be gained in the filter K6.

Figure 16:
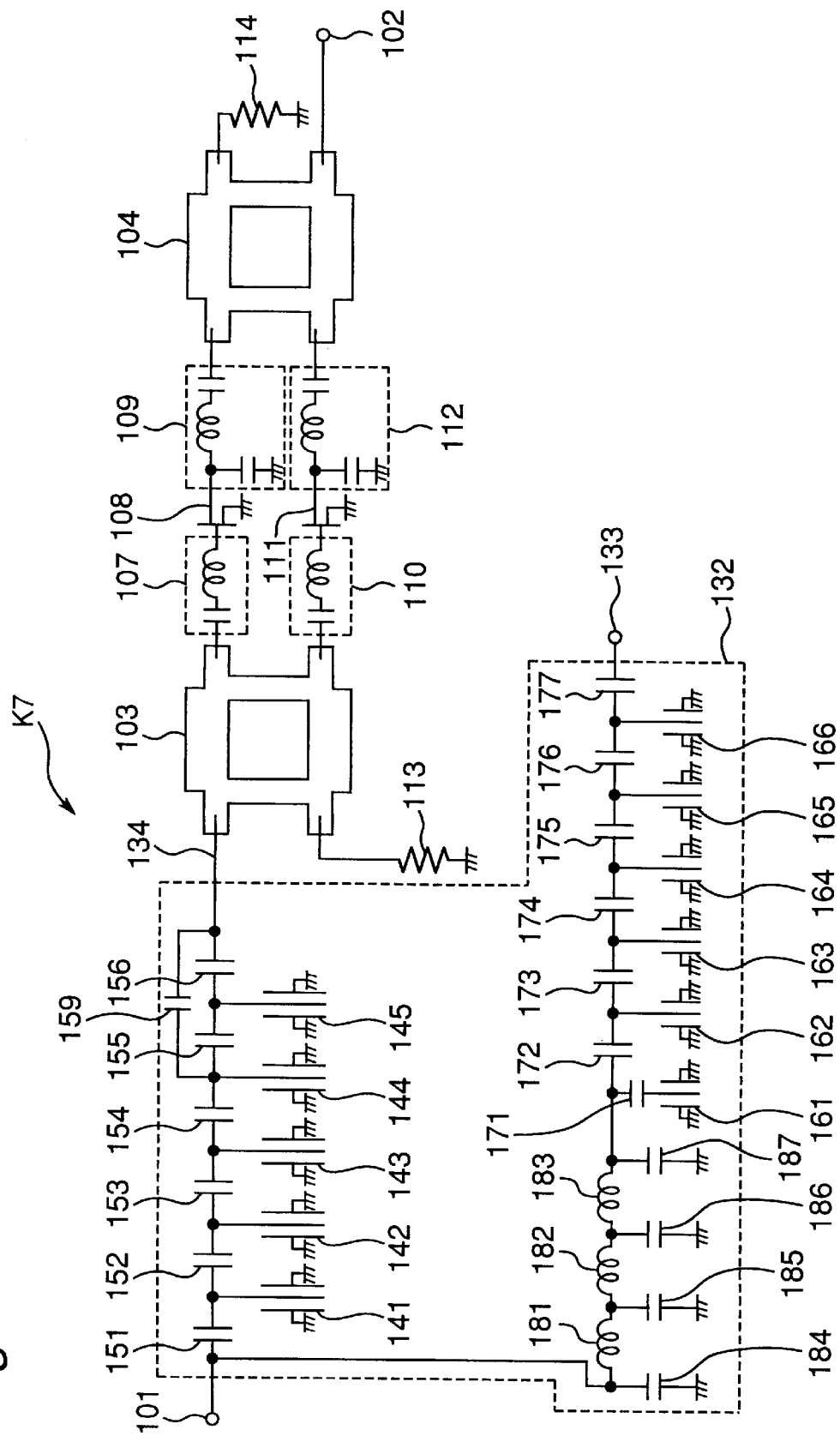
FIG. 16 is a circuit diagram of a filter with a low-noise amplifier, according to a seventh embodiment of the present invention.

FIG. 16 shows a filter K7 with a low-noise amplifier, according to a seventh embodiment of the present invention. In the filter K7, the dielectric resonator 146 and the coupling capacitor 157 are eliminated and the coupling capacitor 159 is employed so as to connect the junction of the coupling capacitors 154 and 155 and the output terminal 134. Since other constructions of the filter K7 are similar to those of the filter K5, the description is abbreviated for the sake of brevity.

In the filter K7, a notch circuit is obtained by connecting the coupling capacitor 159 so as to cause the coupling capacitor 159 to jump over the dielectric resonator 145 in the same manner as the third embodiment. Therefore, the filter K7 is least likely to be affected by, especially, a disturbing signal of a frequency lower than its pass band. Meanwhile, in the filter K7, the number of the dielectric resonators is reduced in comparison with that of the filters K5 and K6. Except for this point, the same effects as those of the filter K5 can be gained in the filter K7.

Meanwhile, in this embodiment, the coupling capacitor 159 is connected so as to jump over the dielectric resonator 145 but may also be connected so as to jump over one of the dielectric resonators 141 to 144.

Figure 17:
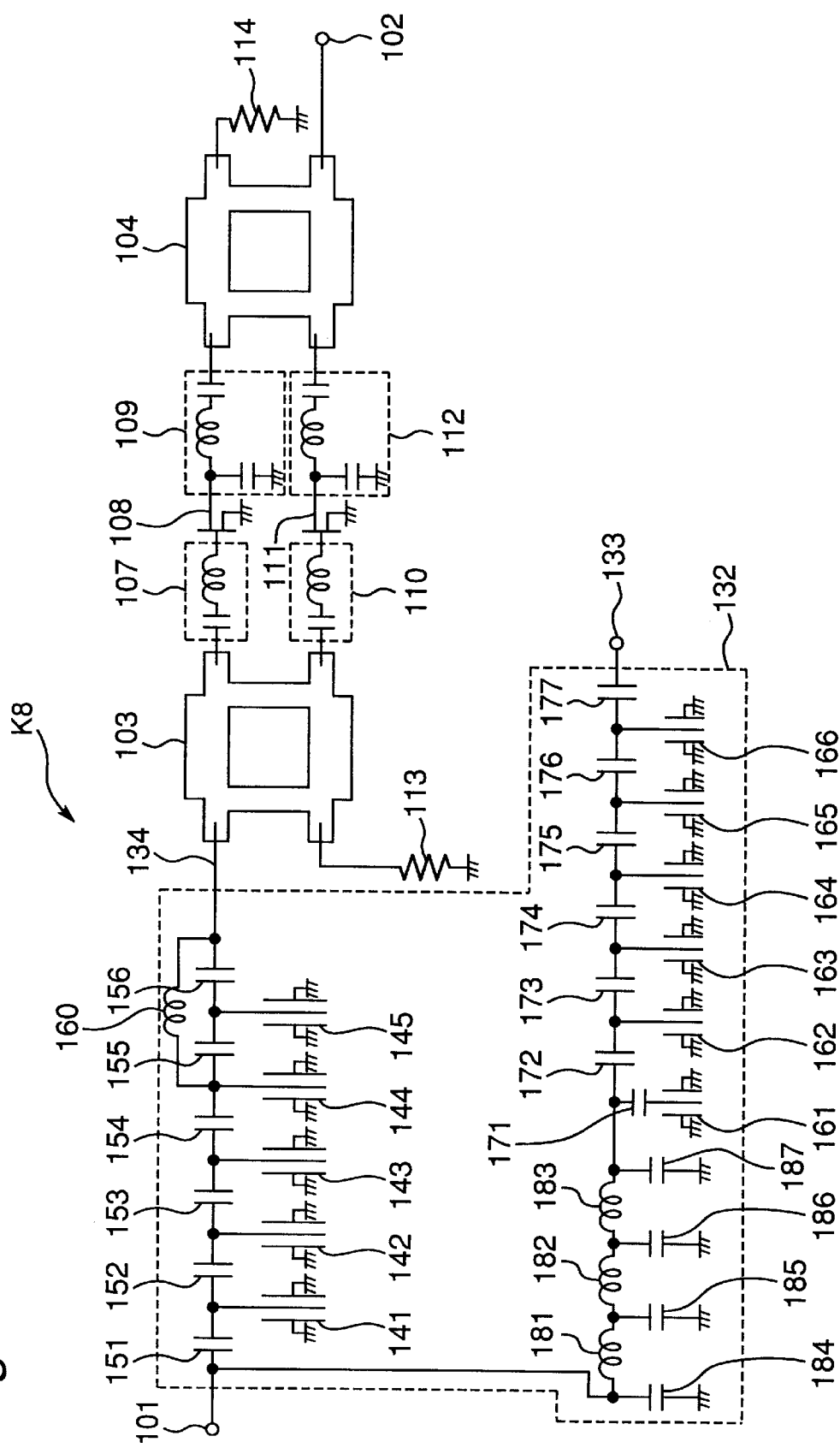
FIG. 17 is a circuit diagram of a filter with a low-noise amplifier, according to an eighth embodiment of the present invention.

FIG. 17 shows a filter K8 with a low-noise amplifier, according to an eighth embodiment of the present invention. In the filter K8, the coupling capacitor 159 of the filter K7 is replaced by the coupling coil 160. Since other constructions of the filter K8 is similar to those of the filter K7, the description is abbreviated for the sake of brevity.

In the filter K8, a notch circuit is obtained by connecting the coupling coil 160 so as to cause the coupling coil 160 to jump over the dielectric resonator 145 in the same manner as the fourth embodiment. Therefore, the filter K8 is least likely to be affected by, especially, a disturbing signal of a frequency higher than its pass band. Meanwhile, in the filter K8, the number of the dielectric resonators is reduced in comparison with that of the filters K5 and K6 in the same manner as the filter K7. Except for these points, the same effects as those of the filter K5 can be achieved in the filter K8.

Meanwhile, in this embodiment, the coupling coil 160 is connected so as to jump over the dielectric resonator 145 but may also be connected so as to jump over one of the dielectric resonators 141 to 144.

What is claimed is:

1. A filter with a low-noise amplifier, comprising:

two amplification circuits, each having an input side, an output side, an amplification element, a noise figure matching circuit connected to an input of said amplification element, and a further matching circuit connected to an output of said amplification element;

a first 3-dB hybrid circuit connected to said input side of said two amplification circuits and including a first input terminal, a second input terminal, a first output terminal, and a second output terminal;

a second 3-dB hybrid circuit connected to said output side of said two amplification circuits and including a first input terminal, a second input terminal, a first output terminal, and a second output terminal;

a filter input terminal; and a filtering device connected between said filter input terminal and said first input terminal of said first 3-dB hybrid circuit;

wherein said second input terminal of said first 3-dB hybrid circuit has a matched termination, said filter input terminal is operable to receive a signal and said second output terminal of said second 3-dB hybrid circuit is operable to output the signal, and said first output terminal of said second 3-dB hybrid circuit has a matched termination.

2. A filter as claimed in claim 1, wherein said filtering device includes at least one notch filter.

3. A filter as claimed in claim 2, wherein said notch filter comprises a capacitor and a resonator.

4. A filter as claimed in claim 3, wherein said notch filter comprises a coil and a resonator.

5. A filter as claimed in claim 2, wherein said notch filter comprises a jump connection over a resonator.

6. A filter as claimed in claim 5, wherein said jump connection comprises a capacitor jump-connected over the resonator.

7. A filter as claimed in claim 5, wherein said jump connection comprises a coil jump-connected over the resonator.

8. A filter with a low-noise amplifier, comprising:

two amplification circuits, each having an input side, an output side, an amplification element, a noise figure matching circuit connected to an input of said amplification element, and a further matching circuit connected to an output of said amplification element;

a first 3-dB hybrid circuit connected to said input side of said two amplification circuits and including a first input terminal, a second input terminal, a first output terminal, and a second output terminal;

a second 3-dB hybrid circuit connected to said output side of said two amplification circuits and including a first input terminal, a second input terminal, a first output terminal, and a second output terminal; and an antenna duplexer having an antenna connection terminal, a transmission connection terminal, and a reception connection terminal;

wherein said second input terminal of said first 3-dB hybrid circuit has a matched termination and said first output terminal of said second 3-dB hybrid circuit has a matched termination, said reception terminal of said antenna duplexer is connected to said first input terminal of said first 3-dB hybrid circuit, said antenna connection terminal of said antenna duplexer is operable to receive a signal and said second output terminal of said second 3-dB hybrid circuit is operable to output the signal.

9. A filter as claimed in claim 8, wherein said antenna duplexer includes at least one notch filter.

10. A filter as claimed in claim 9, wherein said notch filter comprises a capacitor and a resonator.

11. A filter as claimed in claim 9, wherein said notch filter comprises a coil and a resonator.

12. A filter as claimed in claim 9, wherein said notch filter comprises a jump connection over a resonator.

13. A filter as claimed in claim 12, wherein said jump connection comprises a capacitor jump-connected over the resonator.

14. A filter as claimed in claim 12, wherein said jump connection comprises a coil jump-connected over the resonator.

* * * * *